US010374631B2

(12) United States Patent
Tseng et al.

(10) Patent No.: US 10,374,631 B2
(45) Date of Patent: Aug. 6, 2019

(54) LOOK-AHEAD LDPC DECODER

(71) Applicant: Goke US Research Laboratory, Santa Clara, CA (US)

(72) Inventors: Ko-Chung Tseng, Santa Clara, CA (US); Engling Yeo, San Jose, CA (US)

(73) Assignee: Goke US Research Laboratory, Santa Clara, CA (US)

( * ) Notice: Subject to any disclaimer, the term of this patent is extended or adjusted under 35 U.S.C. 154(b) by 24 days.

(21) Appl. No.: 15/683,696

(22) Filed: Aug. 22, 2017

(65) Prior Publication Data

US 2019/0068223 A1 Feb. 28, 2019

(51) Int. Cl.
*H03M 13/00* (2006.01)
*H03M 13/11* (2006.01)

(52) U.S. Cl.
CPC ...... *H03M 13/1131* (2013.01); *H03M 13/116* (2013.01); *H03M 13/616* (2013.01); *H03M 13/6525* (2013.01)

(58) Field of Classification Search
CPC ......... H03M 13/6566; H03M 13/2906; H03M 13/1131; H03M 13/116; H03M 13/616; G06F 3/0619; G06F 3/065; G06F 3/067; G06F 11/1068; G06F 11/1072; G06F 11/076; G06F 2212/403; G11C 29/52; G11C 11/5642; G11C 2211/5621; G11C 2029/0411; G11C 11/5685; G11C 29/028; G11C 29/021
See application file for complete search history.

(56) References Cited

U.S. PATENT DOCUMENTS

| | | | |
|---|---|---|---|
| 9,467,172 B1 | 10/2016 | Graumann et al. |
| 2009/0037799 A1 | 2/2009 | Liu et al. |
| 2015/0052413 A1 | 2/2015 | Eleftheriou et al. |
| 2015/0301887 A1 | 10/2015 | Zhang et al. |
| 2016/0070662 A1 | 3/2016 | Ly et al. |
| 2017/0093429 A1 | 3/2017 | Gunnam et al. |

OTHER PUBLICATIONS

International Search Report, dated Dec. 13, 2018, for corresponding International Application No. PCT/US2018/047553.
Written Opinion of the International Searching Authority, dated Dec. 13, 2018, for corresponding International Application No. PCT/US2018/047553.

*Primary Examiner* — Guerrier Merant
(74) *Attorney, Agent, or Firm* — Intellectual Property Law Group LLP

(57) ABSTRACT

Look-ahead LDPC decoder. In an exemplary embodiment, a method includes generating a message (QA) to a first check node, the QA message is generated from a result (RA) from the first check node, and generating a message (QB) to a second check node, the QB message is generated from the result (RA) and is transmitted to avoid decoder stall. The method also includes receiving a result (R'A) from the first check node, computing a difference (R"A) between the result (R'A) and the result (RA), and receiving a result (R'B) from the second check node. The method also includes computing a bit value P(B) using the difference (R"A) and the result (R'B).

20 Claims, 7 Drawing Sheets

600

| CYCLE | i ADDRESS | AGGRESSOR BIT | VICTIM BIT |
|---|---|---|---|
| 1 | 5 | 0 | 0 |
| 2 | 101 | 1 | 0 |
| 3 | 33 | 0 | 0 |
| ⋮ | | | |
| 8 | 101 | 0 | 1 |
| ⋮ | | | |
| 1000 | 88 | 0 | 0 |

| CYCLE | i ADDRESS | SHIFT | AGGRESSOR BIT | VICTIM BIT |
|---|---|---|---|---|
| 1 | 5 | 6 | 0 | 0 |
| 2 | 101 | 33 | 1 | 0 |
| 3 | 33 | 35 | 0 | 0 |
| ⋮ | | | | |
| 8 | 101 | 83 | 0 | 1 |
| ⋮ | | | | |
| 1000 | 88 | 72 | 0 | 0 |

FIG. 7

LOOK-AHEAD LDPC DECODER

FIELD

The exemplary embodiments of the present invention relate to communication networks. More specifically, the exemplary embodiments of the present invention relate to decoders for receiving and processing data streams in communication networks.

BACKGROUND

With a rapidly growing trend of mobile and remote data access over high-speed communication networks, such as provided by long term evolution (LTE) cellular networks, accurate delivery and deciphering of data streams has become increasingly challenging and difficult.

The use of encoders and decoders has provided a way to improve communication accuracy and network efficiency. One type of coding that is used in communication networks is called Low Density Parity Check (LDPC) coding. In this coding technique, data is encoded into a codeword that describes how a plurality of bit nodes are constrained by a plurality of check nodes. At a receiver, a LDPC decoder is used to process the received transmission to recover the transmitted codeword. The decoder processes the received bits to determine if the constraints have been satisfied, thereby confirming accurate reception of a codeword. If the constraints are not satisfied, the input bits can be adjusted until they satisfy all the constraints. Thus, it is possible to correct errors resulting from transmission loss, signal degradation or noise.

Unfortunately, it is possible that the LDPC decoder encounters a "read-before-write" (RBW) hazard during the decoding operation. A read-before-write hazard can occur when one or more bits are used to determine multiple constraints. In this case, the determination of a particular constraint may have to wait until determination of a prior constraint is completed. If this happens, the decoder is said to have "stalled" while waiting for the prior constraint to complete. The decoding process will take longer to complete if the decoder "stalls" such that the decoder may not have enough time to complete the data decoding operation within the available time interval.

Therefore, it is desirable to have a mechanism that reduces or eliminates read-before-write hazards in an LDPC decoder and thereby provides improved performance over conventional decoders.

SUMMARY

A look-ahead LDPC decoder is disclosed. In various exemplary embodiments, the look-ahead LDPC decoder determines potential stalling conditions when a bit node is constrained by two check nodes. To compute the bit node value, a cache stores a first result received from the first check node. Updated bit node information is transmitted to both the first and second check nodes using the first result. When a second result is received from the first check node, a check node difference value for the first check node is computed from the two results. When a result from the second check node is received, the difference value is used with the result from the second check node to compute the bit node value. Thus, the decoder avoids stalling since computations at the second check node do not wait for the results from the first check node.

In an exemplary embodiment, a method is provided that includes generating a message (QA) to a first check node, the QA message is generated from a result (RA) from the first check node, and generating a message (QB) to a second check node, the QB message is generated from the result (RA) and is transmitted before decoder stall. The method also includes receiving a result (R'A) from the first check node, computing a difference (R"A) between the result (R'A) and the result (RA), and receiving a result (R'B) from the second check node. The method also includes computing a bit value P(B) using the difference (R"A) and the result (R'B).

In an exemplary embodiment, an apparatus is provided that includes means for generating a message (QA) to a first check node; the message (QA) determined from a result (RA) from the first check node, and means for generating a message (QB) to a second check node from the result (RA). The apparatus also includes means for receiving a result (R'A) from the first check node, and means for computing a difference (R"A) between the result (R'A) and the result (RA). The apparatus also includes means for receiving a result (R'B) from the second check node, and means for computing a bit value P(B) using the difference (R"A) and the result (R'B).

In an exemplary embodiment, an apparatus is provided that includes detecting a read before write (RBW) hazard associated with first and second check nodes, and generating messages (QA) and (QB) to the first and second check nodes, respectively. The (QA) and (QB) messages are generated from a result (RA) from the first check node. The method also includes receiving a result (R'A) from the first check node and a result (R'B) from the second check node, and computing a new bit node value based on the result (R'A) and the result (R'B).

Additional features and benefits of the exemplary embodiments of the present invention will become apparent from the detailed description, figures and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

FIG. 6 shows an exemplary embodiment of a decoding instructions that includes a cycle indicator and an index (i) address;

FIG. 7 shows another exemplary embodiment of decoding instructions wherein each address index (i) refers to a group of Q bit nodes;

DETAILED DESCRIPTION

Figure 1:
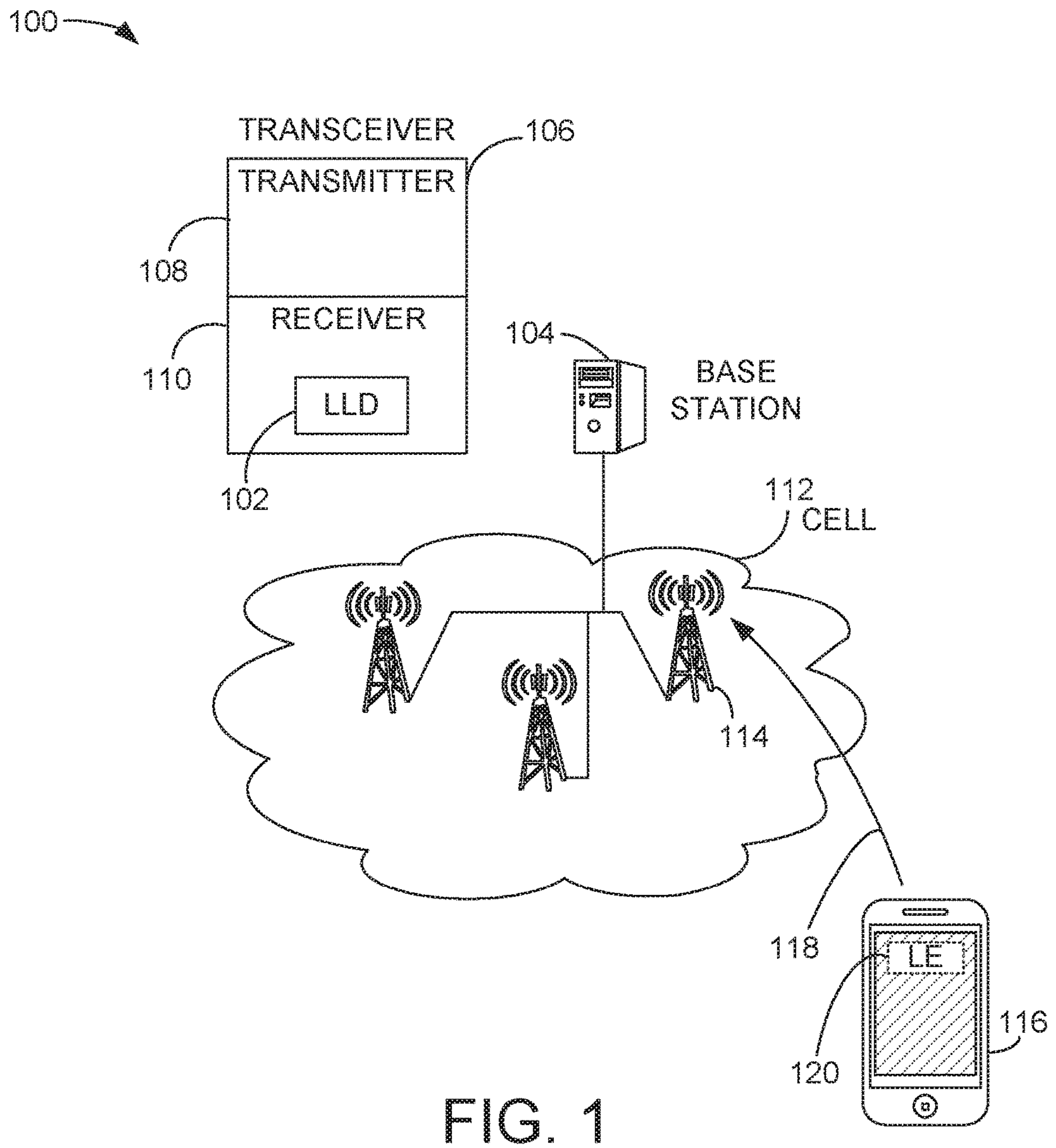
FIG. 1 shows a communication network comprising a transceiver having an exemplary embodiment of a look-ahead LDPC decoder.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application and/or business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

FIG. 1 shows a communication network 100 comprising a transceiver 106 having an exemplary embodiment of a look-ahead LDPC decoder (LLD) 102. The communication network 100 has a base station 104 that includes the transceiver 106. The transceiver 106 includes transmitter 108 and receiver 110. The base station 104 utilizes the transceiver 106 to communicate with radio towers (e.g., tower 114) located in cell site 112.

User equipment (UE) 116 transmits uplink communications 118 to the base station 104 through tower 114. For example, the UE 116 may be a cellular phone, handheld device, tablet computer or iPad® device, or any other type of communication device. It should be noted that the underlying concepts of the exemplary embodiments of the present invention would not change if one or more devices were added or removed from the communication network 100.

The UE 116 transmits its signal through the uplink channel 118. The transmitted uplink signal may suffer from errors resulting from transmission loss, signal degradation or noise. To improve data reception for the uplink communications, the UE 120 includes a LDPC encoder (LE) 120. The LE 120 encodes the data into codewords before transmission over the uplink channel 118. Encoding the data into codewords allows the data to be recovered at the base station 104 even if some errors occur during transmission.

The codewords transmitted over the uplink channel 118 are received by the receiver and decoded by the LLD 102 to recover the transmitted data. The LLD 102 operates to process the received transmission to recover the transmitted codeword. The LLD 102 processes the received bits to determine if the codeword constraints have been satisfied, thereby confirming accurate reception of each codeword. If the constraints are not satisfied, the input bits can be adjusted until they satisfy all the constraints.

In various exemplary embodiments, the LLD 102 determines potential read-before-write hazards during the decoding process. If a potential hazard is detected, the LLD 102 performs a look-ahead function that prevents stalls, thereby allowing the decoding process to complete within the available time interval. A more detailed description of the LLD 102 is provided below.

Figure 2:
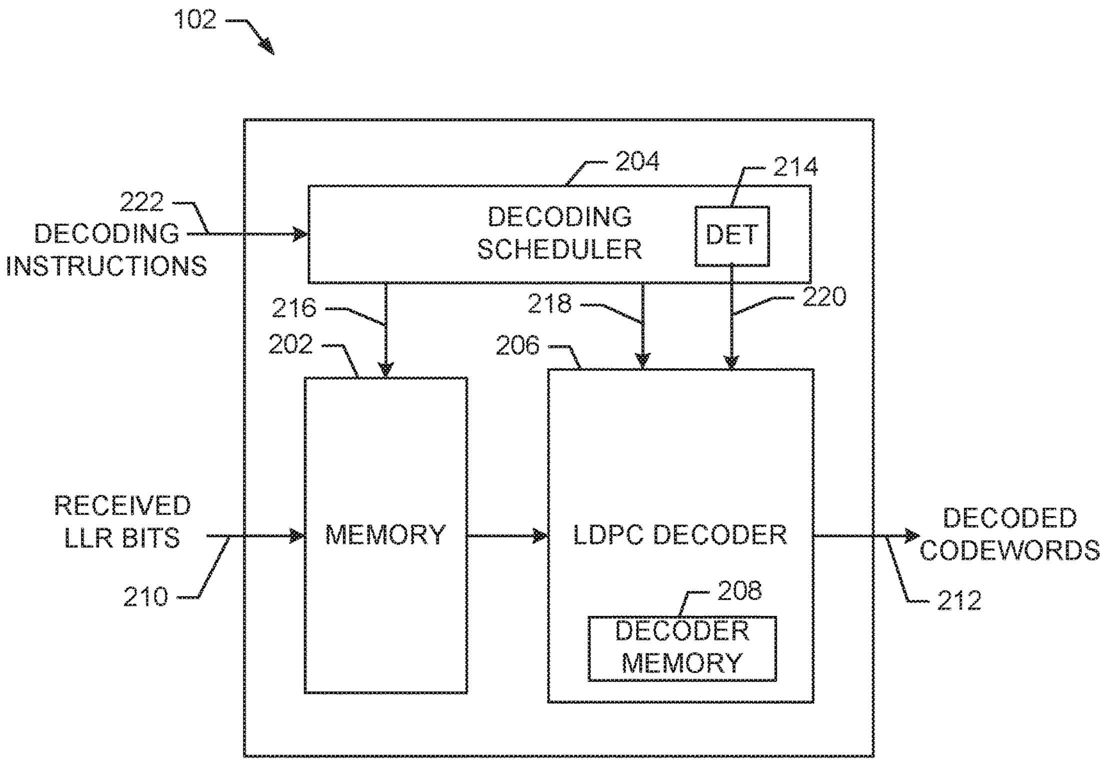
FIG. 2 shows an exemplary block diagram of the look-ahead LDPC decoder shown in FIG. 1.

FIG. 2 shows an exemplary block diagram of the look-ahead LDPC decoder (LLD) 102 shown in FIG. 1. The LLD 102 comprises a memory 202, decoding scheduler 240, and LDPC decoder 206. The decoding scheduler 204 includes a RBW detector 214 and the LDPC decoder 206 includes a decoder memory 208.

In an exemplary embodiment, the decoding scheduler 204 receives decoding instructions 222 that describe how received data is to be decoded by the decoder 206. During operation, the memory 202 receives LLR bits 210 recovered from a received uplink communication. For example, the uplink communication may be from UE 116 shown in FIG. 1. The uplink communication includes data that is encoded by the LDPC encoder 120. The memory 202 stores the received LLR bits under the control of the decoding scheduler 204 using memory control signal 216.

The LDPC decoder 206 operates to perform a look-ahead LDPC decoding operation that prevents RBW stalling. For example, as will be described in greater detail below, the decoding scheduler 204 operates to schedule how the received LLR bits are retrieved from the memory 202 and input to the LDPC decoder 206. For example, in an exemplary embodiment, a sequence of scheduling instructions 222 are loaded into the decoding scheduler 204 and these instructions are used to determine the memory addresses of data in the memory 202 that are to be input to the decoder 206. The decoding scheduler 204 also outputs a decoder control signal 218 to control the operation of the decoder 206.

The RBW detector 214 determines when a RBW condition may occur and controls the decoding process of the LDPC decoder 206 to mitigate stalling. For example, when a RBW operation is detected, the detector 214 outputs a RBW detection signal 220 to the decoder 206 to start RBW mitigation operations. In an exemplary embodiment, RBW hazards are encoded into the decoding instructions so that the detector 214 has knowledge of the LDPC code being utilized and thereby knows in advance when the decoding instructions will result in a RBW condition. In another exemplary embodiment, the detector 214 monitors the decoding instructions and determines on-the-fly (OTF) when the decoding instructions will result in a RBW condition.

The RBW condition occurs when a bit node is constrained by two check nodes and operations for the second check node must wait (e.g., stalls) for results from the first check node. To mitigate the RBW condition, the detector 214 outputs the RBW detection signal 220 which controls the decoder 206 to utilize the memory 208 to store a result from the first check node and that result is later used to correct a check node result of the second check node. Thus, the operations of the second check node can proceed without having to wait for results from the first check node. A more detailed description of the LLD 102 is provided below.

Figure 3:
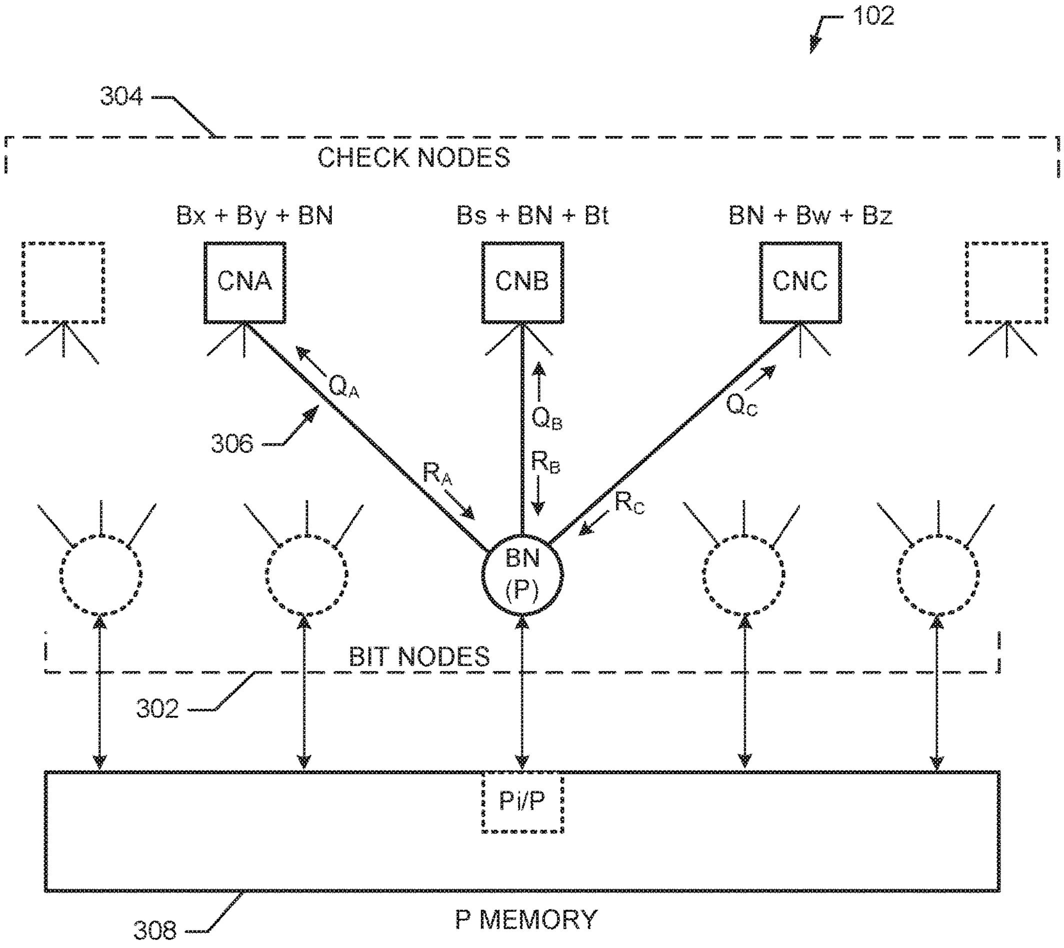
FIG. 3 shows an exemplary bi-partite graph that illustrates the operation of the look-ahead LDPC decoder to prevent read-before-write hazards.

FIG. 3 shows an exemplary bi-partite graph 300 that illustrates the operation of the LLD 102 to prevent read-before-write hazards. The graph 300 illustrates two classes of nodes, namely, bit nodes (BN) 302 and check nodes (CN) 304. Each bit node represents a single bit (e.g., with value of 0 or 1) in a codeword. Each check node represents a parity check constraint. For example, a group of bit nodes that are connected to a particular check node are constrained such that an exclusive “OR” (XOR) function of all the bit information received by the check node should result in a value of zero. In finite field arithmetic, a field having two elements can be referred to as a two element Galois Field (e.g., GF(2)). In such a field, an XOR function is identical to the addition “+” operator. Thus, for each check node, there is a constraint equation (using+) that is used to process the values received from the bit nodes.

During operation, all bit nodes 302 are updated at the same time with received LLR bit information. Messages between the bit nodes 302 and the check nodes 304 are sent along edges 306. The check nodes 304 receive input messages (Qi) simultaneously and perform an update according to their constraint equations. Additionally, the check nodes 304 send updated messages (Ri) along their associated edges to the appropriate bit nodes 102.

As illustrated in FIG. 3, Ri represents messages sent from check node CNi to the BN. Qi represents messages sent from the BN to the check node CNi. Pi is an initial LLR bit value read from P memory 308. For example, in an exemplary embodiment, the P memory 308 is part of the memory 202 shown in FIG. 2. After the LDPC decoder has completed a first iteration, the calculated value (P) at BN is given by the following equation.

$$P=Pi+RA+RB+RC$$

The BN updates the value of P in the order that messages are received from check nodes CNA, CNB, and CNC. At the start of the next iteration, BN computes QA, which is the bit-to-check node message intended for CNA according to equation (1) below.

$$QA=P-RA=Pi+RB+RC \tag{1}$$

As shown in equation (1), the message QA is determined by subtracting the previously received RA from the value P. The check node CNA will evaluate this QA message and return a new (or updated) message, R'A to the BN. The new message (R'A) indicates check node CNA’s determination of the value of BN based on the received messages and constraints associated with check node CNA. The BN then updates the value of P with the new R'A message according to equation (2) below.

$$P=QA+R'A=Pi+RB+RC+R'A \tag{2}$$

The above operations are repeated with respect to check node CNB. For example, the new check-to-bit message from CNB will be R'B as expressed in equation (3) below. It should be noted that the value of RA has been replaced with the updated value R'A from the above operations.

$$QB=P-RB=Pi+RC+R'A \tag{3}$$

As shown in equation (3), the message QB is determined by subtracting the previously received RB from the value P. The check node CNB will evaluate this QB message and return a new message, R'B to the BN. The new message (R'B) indicates check node CNB determination of the value of BN based on the received messages and constraints associated with check node CNB. The BN then updates the value of P with the new R'B message according to equation (4) below.

$$P=QB+R'B=Pi+RC+R'A+R'B \tag{4}$$

The above operations are repeated with respect to check node CNC. For example, the new check-to-bit message from CNC will be R'C as expressed in equation (5) below. It should be noted that the values of RA and RB have been replaced with updated values R'A and R'B from the above operations.

$$QC=P-RC=Pi+R'A+R'B \tag{5}$$

As shown in equation (5), the message QC is determined by subtracting the previously received RC from the value P. The check node CNC will evaluate this QC message and return a new message, R'C to the BN. The new message (R'C) indicates check node CNC’s determination of the value of BN based on the received messages and constraints associated with check node CNB. The BN then updates the value of P with the new R'C message according to equation (6) below.

$$P=QC+R'C=Pi+R'A+R'B+R'C \tag{6}$$

Read-Before-Write Hazard

A read-before-write hazard occurs when computations at a particular check node must wait (or stall) until a value is determined at a prior or earlier check node. For example, determining the value QB in equation (3) requires the receipt of R'A, which is used to obtain the result of equation (2). In other words, the result of P from equation (2) should be written into P memory 308 prior to the next operation to determine QB (equation (3)), which reads the value from P memory. However, it is possible that the computation of equation (3) may be required even before the computation of equation (2) can be completed. This decoding situation creates a read-before-write hazard since the computations at a particular check node (e.g., CNB) require a value that is in the process of being determined by a prior or early check node (e.g., CNA).

Referring again to FIG. 3, a more detailed description of the read-before-write hazard will be presented. As above, the following equation can be used to determine the value P after the first decoding iteration.

$$P=Pi+RA+RB+RC$$

Assuming a read-before-write hazard exists, then the value of P will not be updated between equation (1) and equation (3). The computed values of QA and QB then will be determined from equations (7) and (8) below.

$$QA=P-RA=Pi+RB+RC \tag{7}$$

$$QB=P-RB=Pi+RA+RC \tag{8}$$

If this decoding process is allowed to continue its course, the later stages of the process will evaluate and update the LLR value P according to equations (9) and (10) below.

$$P(A)=QA+R'A=Pi+RB+RC+R'A \tag{9}$$

$$P(B)=QB+R'B=Pi+RA+RC+R'B \tag{10}$$

Thus, the value P(A) represents the result after BN and CNA exchange information and the value of P(B) represents the result after BN and CNB exchanges information. In fact, P(B) may potentially overwrite P(A) in the P memory. For example, it should be noted that equation (10) differs from equation (4), since equation (10) is equivalent to having ignored the messages exchanged with CNA.

Mitigating Read-Before-Write Hazard

In various exemplary embodiments, the LLD 102 operates to eliminate or mitigate the read-before-write hazard. For example, in an exemplary embodiment, the LLD 102 performs the following operations when a potential read-before-write hazard is detected.

A. Store the value of RA during equation (7) in a cache buffer. For example, the value of RA used to computer the QA messages is stored in the cache buffer 208.

B. When R'A becomes available during equation (9), replace the contents in the buffer with a new value (R"A) determined by the following expression.

$$R''A=(R'A-RA) \quad (11)$$

C. Finally, instead of evaluating equation (10), perform the following computation with the new value (R"A) according to equation (12) to obtain P(B).

$$P(B)=QB+R'B+R''A=Pi+R'A+R'B+RC \quad (12)$$

Therefore, the LLD 102 operates to mitigate the read-before-write hazard as described above to avoids decoder stalls. As a result, the computation and transmission of QB can start even before all the processing by CNA has been completed.

Read-Before-Write Hazard Associated with More than Two Check Nodes

The exemplary embodiments described herein mitigate or eliminate stalling due to a RBW hazard between two check nodes (A and B) that are adjacent to a bit node. However, in principle, a RBW hazard can occur between two or more check nodes that are adjacent to each bit node. For example, a RBW hazard can occur between three check nodes (e.g., A, B, and C) that are adjacent to a bit node. In this case, the operations and methods described herein are extended to mitigate or eliminate stalling due to a RBW hazard detected between three or more check nodes that are adjacent to the bit node. For example, in the case of a RBW hazard detected between three check nodes, the processing of QB for the second check node is dependent on results from R'A, while the processing of QC for the third check node is dependent on results from both R'A and R'B. Thus, the disclosed methods and operations can be extended to mitigate or eliminate stalling due to a RBW hazard between two or more check nodes that are adjacent to a bit node.

Figure 4:
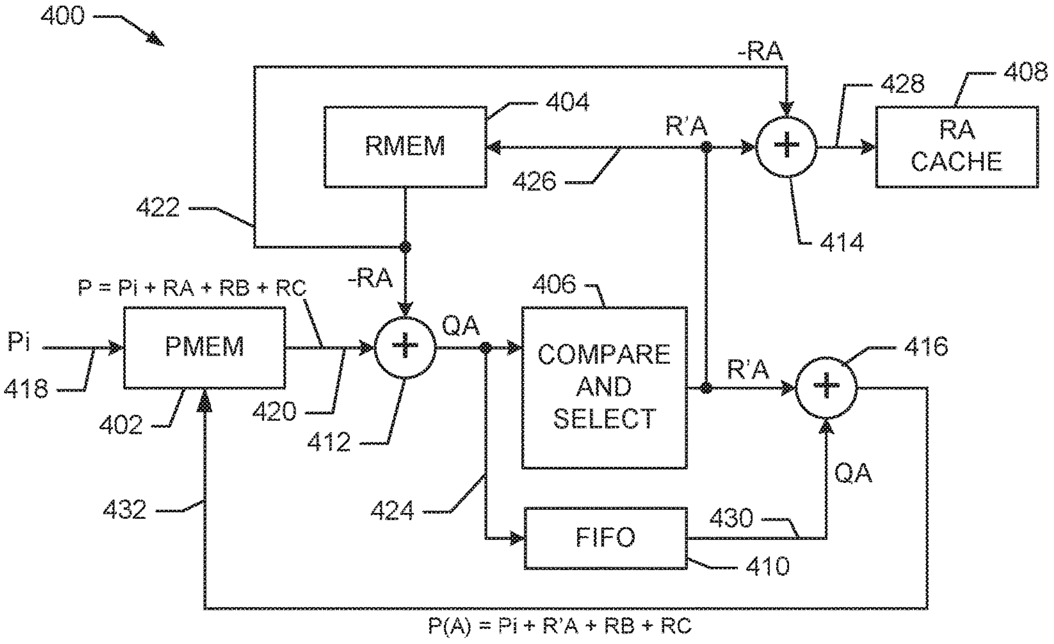
FIG. 4 shows an exemplary embodiment of a LDPC decoder circuit that is part of the look-ahead LDPC decoder shown in FIG. 2.

FIG. 4 shows an exemplary embodiment of a LDPC decoder circuit 400 that is included in the LLD 102. The decoder circuit 400 determines results for the equations (7), (9), and (11) above. The decoder circuit 400 comprises P memory (PMEM) 402, R memory (RMEM) 404, compare and select unit 406, R cache 408 and a first-in-first-out (FIFO) circuit 410. The decoder circuit 400 also comprises addition (or summation) circuits 412, 414, and 416. It should be noted that in an exemplary embodiment, the P memory 402, R memory 404 and R cache 408 are part of the decoder memory 208. In an exemplary embodiment, the decoder circuit 400 is activated when the detector 214 detects a RBW condition and outputs the detection signal 220.

It will be assumed that the P memory 402 receives Pi 418 and holds the value of P after the first iteration. Thus, the P memory 402 outputs the first iteration value of P expressed as (P=Pi+RA+RB+RC), as shown at 420. The R memory 404 stores Ri values received from the check nodes CNi. The value RA received from check node CNA during the first iteration is output from the RMEM 404 as (−RA) 422 to the addition circuit 412. The addition circuit 412 adds the value −RA with the P value to generate QA 424 as expressed in equation (7). The value of QA is input to the FIFO 410.

The compare and select circuit 406 performs operations corresponding to the check node CNA to receive the QA message and generate an R'A message 426, which is input to the R memory 404, and the addition circuits 414 and 416. The addition circuit 414 adds R'A with −RA to generate a value R"A expressed as (R'A−RA) shown in equation (11) that is input to the RA cache 408. Thus, the value (R'A−RA) is stored when a read-before-write hazard condition is detected.

The addition circuit 416 the values of R'A output from the compare and select circuit 406 and the value QA output from the FIFO 410 to generate the value for P(A) as expressed in equation (9). Thus, the decoder circuit 400 operates to perform the equations (7), (9), and (11) above when a read-before-write hazard is detected.

Figure 5:
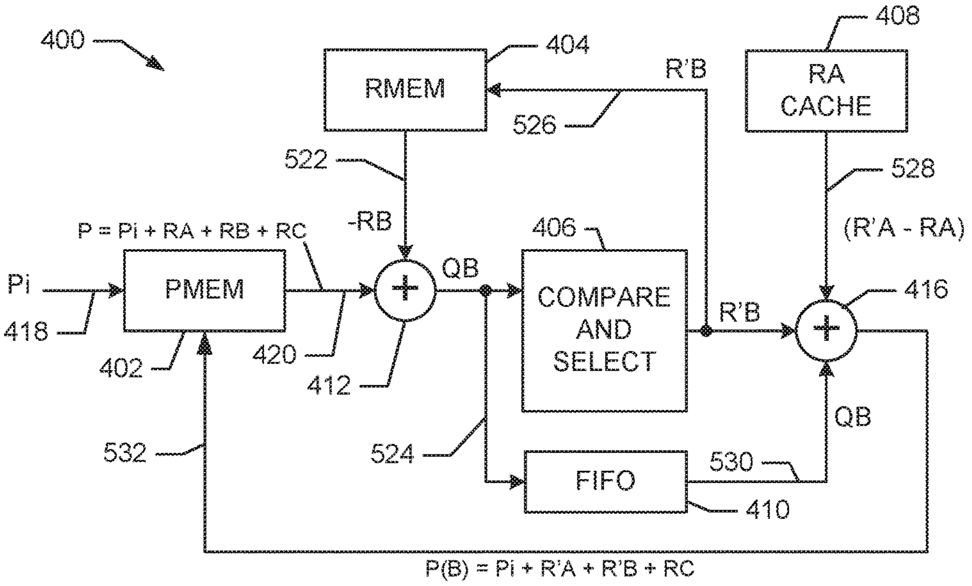
FIG. 5 shows an exemplary embodiment of the LDPC decoder circuit shown in FIG. 4.

FIG. 5 shows an exemplary embodiment of the LDPC decoder circuit 400 that operates to determine the equations (8) and (12) above.

It will be assumed that the P memory 402 holds the value of P after the first iteration. Thus, the P memory 402 outputs the first iteration value of P expressed as (P=Pi+RA+RB+RC), as shown at 420. The R memory 404 stores Ri values received from the check nodes CNi. The value RB received from check node CNB during the first iteration is output from the RMEM 404 as (−RB) 522 to the addition circuit 412. The addition circuit 412 adds the value −RB 522 with the P value 420 to generate QB 524 as expressed in equation (8), which then is input to the FIFO 410 and the compare and select circuit 406.

The compare and select circuit 406 performs operations corresponding to check node CNB to receive the QB message and generate an R'B message 526, which is input to the R memory 404 and the addition circuit 416. The addition circuit 416 adds the values of R'B output from the compare and select circuit 506, the value QB output from the FIFO 410, and the value (R'A−RA) 528 output from the RA cache 408 to generate the value for P(B) 532 as expressed in equation (12). Thus, the decoder circuit 400 operates to perform the equations (8) and (12) above when a read-before-write hazard is detected.

Accordingly, the decoder circuit 400 perform read-before-write hazard mitigation in an LDPC decoder. For example, the R cache 408 stores the value (R'A−RA), which is substituted for RA in equation (10), thereby allowing P(B) to be determined without waiting (stalling) until the determination of P(A) in equation (9) is completed.

Decoding Scheduler

The decoding scheduler 204 schedules a sequence of decoding instructions that control the cycle-to-cycle operation of the LDPC decoder 206. In practice, there may be only a single or a small number of code definitions. Therefore, in an exemplary embodiment, identification of RBW hazards can be incorporated into the decoding instructions.

The detector 214 detects RBW hazards. For example, in an exemplary embodiment, the detector 214 detects one or more bits or indicators in the decoding instructions that indicate a RBW hazard in the decoding process. Thus, in this embodiment, the detector 214 detects RBW hazards from information included in the decoding instructions.

In another exemplary embodiment, the detector 214 monitors the decoding instructions to detect RBW hazards on-the-fly during the decoding process.

FIG. 6 shows an exemplary embodiment of decoding instructions 600 that includes a cycle indicator and an index (i) address. The decoding instructions provide an address index (i) into P memory for each cycle. As discussed above, the operations corresponding to CNA and CNB result in a read-before-write (RBW) hazard. CNA is called the aggressor (and so indicated in FIG. 6) because it causes CNB to read wrongly during its initial read operation. CNB is therefore, called the victim (and also indicated in FIG. 6).

The decoding instructions 600 shown in FIG. 6 also include victim and aggressor bits. An instruction look-ahead system can add a bit to indicate a potential RBW hazard aggressor and another bit to indicate a RBW hazard victim as shown. Thus, the decoding instructions are configured to include RBW indicators that can be accessed by the detector 214 to determine when a RBW hazard will occur. In another embodiment, the detector 214 monitors the decoding instructions and detects RBW hazards on-the-fly based on the operation of the decoding instructions. Once the detector 214 detects a RBW hazard, it signals the decoder 206 using the RBW detection signal 220 to initiate the RBW mitigation operations described above.

Quasi-Cyclic LDPC Code

Each LDPC code can be fully defined by a parity check matrix, denoted as $H_{(N-K)\times N}$. All hardware supported codes will be quasi-cyclic. In an exemplary embodiment, the LDCP decoder utilizes a quasi-cyclic LDPC code where the parity check matrix can be partitioned into many (Q×Q) square matrices. Thus, the $H_{(N-K)\times N}$ matrix can be expressed as a collection of horizontally and vertically stacked sub-matrices of dimensions 128×128. Each of these sub-matrices are either the all-zero matrix, or a cyclic permutation of the 128×128 identity matrix. A permutation matrix is an identity matrix with each row circularly shifted by the same value, thereby maintaining a shifted diagonal property.

An implementation of a quasi-cyclic decoder typically includes a circular shifter. Instead of reading a single Pi value in each cycle, the system reads (Q×Pi) values in parallel. Each vector of Pi values is circularly rotated with a different shift value. Thus, the schedule will also include a shift value.

FIG. 7 shows another exemplary embodiment of decoding instructions 700 wherein each address index (i) refers to a group of Q bit nodes. Note that in cycle 2 and 8, the P-Memory is read with the same addresses (e.g., 101). However, the vectors of P messages in the two cycles are not circularly shifted by the same amounts. Hence, the hardware calculation of the vectors for R'A and R'B will not be circularly aligned with each other.

Figure 8:
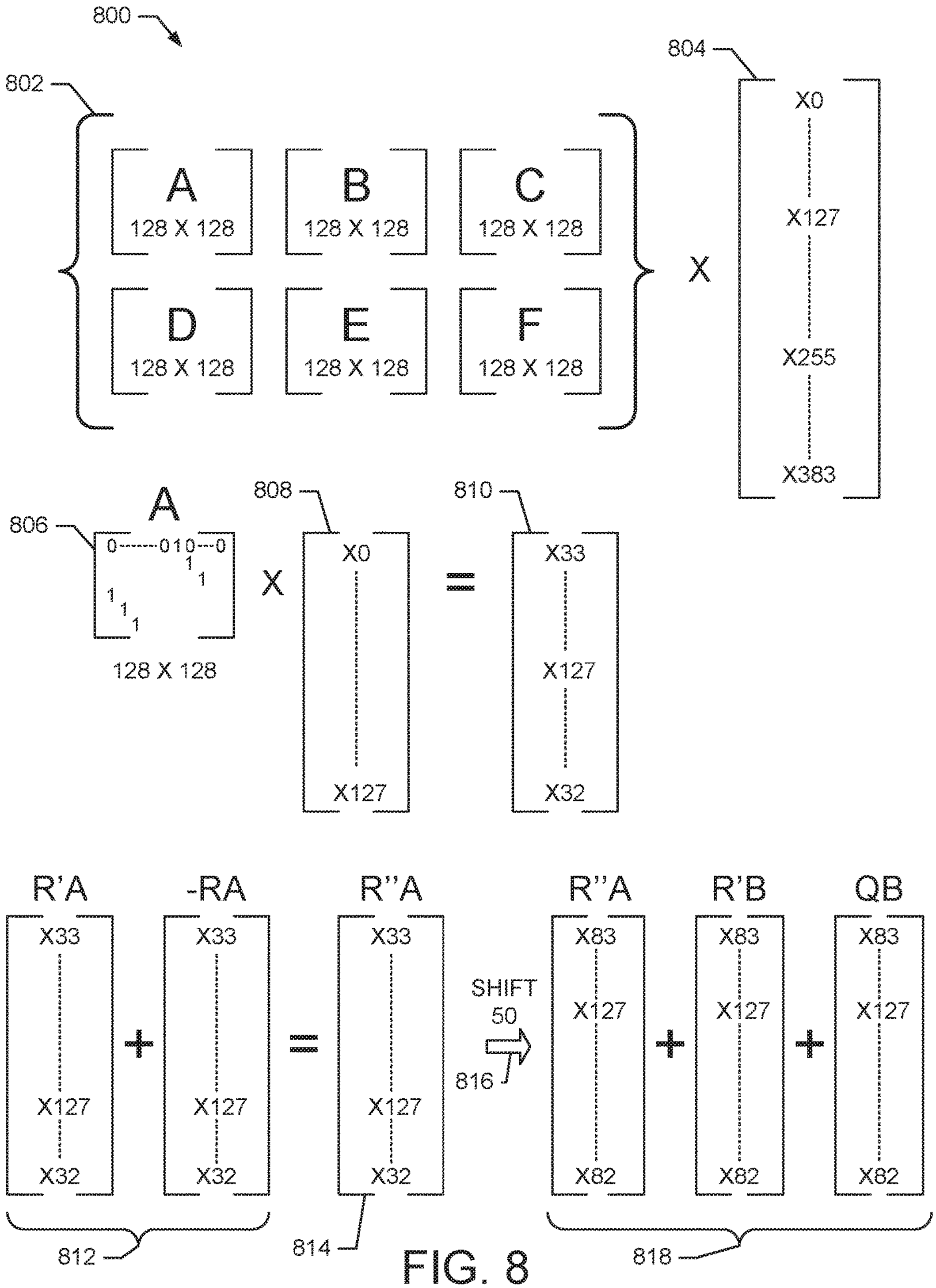
FIG. 8 shows an exemplary embodiment of decoder operations that perform the decoding instructions shown in FIG. 7.

FIG. 8 shows an exemplary embodiment of decoder operations 800 that perform the decoding instructions 700 shown in FIG. 7. As illustrated in FIG. 8, a parity check matrix 802 (e.g., $H_{(N-K)\times N)}$) is partitioned into (Q×Q) square sub-matrices, where Q is 128. Each of these sub-matrices are either an all-zero matrix or a cyclic permutation of a 128×128 identity matrix. Also shown is bit node vector 804.

To illustrate an example, it will be assumed that sub-matrix A 806 is a cyclically shifted identity matrix where each row is shifted by 33-bit positions. Multiplying sub-matrix A 806 by a portion of the bit node matrix 808 results in a shifted version of the bit node matrix as shown at 810. Thus, to determine the result P(B) in equation (12) above, the matrices for RA, R'A, and R'B are aligned to account for this cyclic shifting. For example, as illustrated in the decoding instructions 700, cycle 2 utilizes bits starting at (i) address 101, and these bits are shifted by 33-bit positions. Cycle 8 also operates on bits at (i) address 101, but these bits are shifted by 83-bit positions.

In order to evaluate the expression [R'B (shifted by 83)+R'A (shifted by 33)−RA (shifted by 33)], the vector results of (R'A−RA) are shifted by 50-bit positions to align with R'B. Thus, as illustrated in FIG. 8, the sum 806 of (R'A+(−RA)) is combined to generate R"A shown in equation (11) above. For example, this sum is generated by the addition circuit 414 shown in FIG. 4. The result is stored in the RA cache 408 look-ahead buffer. The cache 408 also stores the additional circular shift version of the results (R'A-RA). For example, as illustrated in FIG. 8, R"A is cyclically shifted 50-bit positions as indicated at 806. This result also can be stored in the cache 408. The value P(B) shown in equation (12) above is determined by adding the shifted R"A with R'B and QB as illustrated at 808. This operation is performed by the addition circuit 416 shown in FIG. 5.

Figure 9:
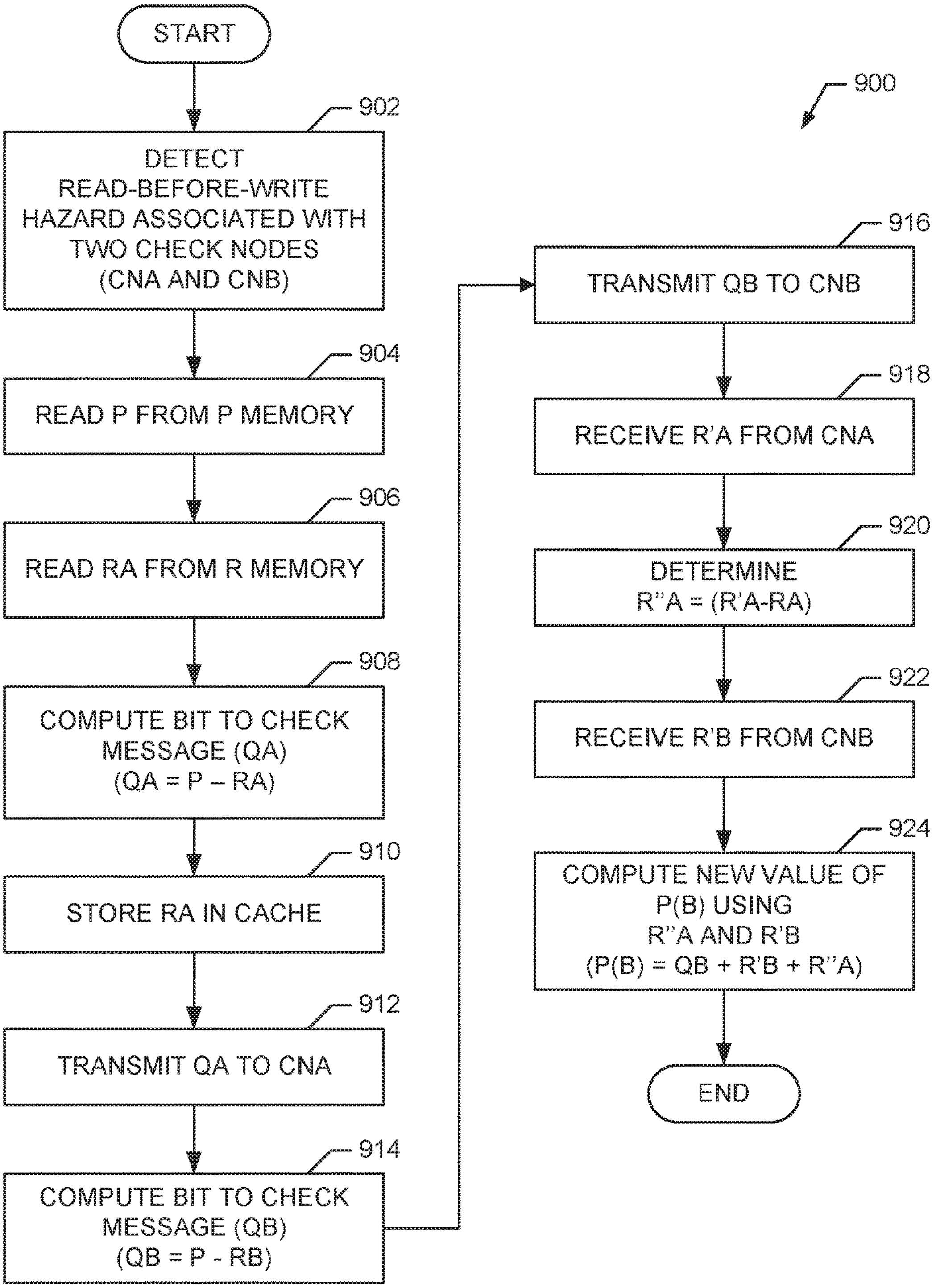
FIG. 9 shows a method for performing LDPC decoding that mitigates RBW stalling.

FIG. 9 shows a method 900 for performing LDPC decoding that mitigates RBW stalling. For example, in an exemplary embodiment, the method 900 is suitable for use by the LLD 102 shown in FIG. 2. It will be assumed for the following description that the decoder has already initialized and continues to operate performing LDPC decoding. It is also assumed that no RBW hazard exists with regards to CNC shown in FIG. 3, and therefore no interaction or messaging with CNC is presented below.

At block 902, a read-before-write hazard is detected for a LDPC decoding operation. The RBW hazard is detected when two check nodes constrain a selected bit node and the potential exists for decoder stalling. For example, as illustrated in FIG. 3, the check nodes CNA and CNB both constrain bit node BN. In an exemplary embodiment, the detector 214 in FIG. 2 detects the RBW hazard from the LDPC code by analyzing the decoding instructions used by the decoding scheduler or from a priori knowledge of the code. In another exemplary embodiment, the detector 214 detects the RBW hazard on-the-fly during the decoding operation.

At block 904, a P value is read from memory. For example, as illustrated in FIG. 3, the value P is stored in the P memory 308.

At block 906, an RA value is read from memory. For example, as illustrated in FIG. 4 and FIG. 5, the value RA is read from the R memory 404.

At block 908, a bit-to-check node message QA is computed. For example, the bit-to-check node message QA is computed according to (QA=P−RA) as shown in Eq. (7).

At block 910, the value of RA is stored. For example, the value of RA is stored in the cache 408 shown in FIGS. 4-5.

At block 912, the QA message is transmitted to check node CNA. For example, as illustrated in FIG. 3, QA is transmitted from BN to CNA over one of the edges 306.

At block 914, a bit-to-check node message QB is computed. For example, the bit-to-check node message QB is computed according to (QB=P−RB) as shown in Eq. (8). It should be noted that the QB message is computed using RA and does not wait to receive an updated RA from CNA.

At block 916, the QB message is transmitted to check node CNB. For example, as illustrated in FIG. 3, QB is transmitted from BN to CNB over one of the edges 306. By transmitting the message QB before R'A is received from CNA, a decoder stall is avoided.

At block 918, an R'A message is received from CNA. For example, as illustrated in FIG. 3, R'A is transmitted from CNA to BN over one of the edges 306. The R'A value represents an updated bit estimate from CNA.

At block 920, a difference value (R"A) is computed from (R'A−RA). For example, the value RA is used to compute the difference value (R"A) as shown in Eq. (11). In an exemplary embodiment, the difference value R"A is computed by the addition circuit 414 and stored in the RA cache 408.

At block 922, an R'B message is received from CNB. For example, as illustrated in FIG. 3, R'B is transmitted from CNB to BN over one of the edges 306. The R'B value represents an updated bit estimate from CNB.

At block 924, a new value P(B) is computed. For example, the value of P(B) is computed using the difference value (R'A−RA) and R'B. The value of P(B) is computed according to (P(B)=QB+R'B+R"A) as shown in Eq. (12). Thus, the computation of P(B) occurs without stalling since the computation of QB did not have to wait for the result R'A.

Thus, the method 900 operates to perform LDPC decoding that mitigates or eliminates RBW stalling. It should be noted that the method 900 is exemplary and that the operations can be modified, rearranged, added to, deleted, or otherwise changed within the scope of the embodiments. It should also be noted that method can be extended to mitigate or eliminate RBW stalling if it is detected that a RBW hazard exists for more than two check nodes (e.g., a RBW hazard is detected for three or more check nodes that are adjacent to a bit node).

While particular embodiments of the present invention have been shown and described, it will be obvious to those skilled in the art that, based upon the teachings herein, changes and modifications may be made without departing from the exemplary embodiments of the present invention and its broader aspects. Therefore, the appended claims are intended to encompass within their scope all such changes and modifications as are within the true spirit and scope of this exemplary embodiments of the present invention.

What is claimed is:

1. A method performed by a digital data decoder, comprising:

determining that a Read-Before-Write (RBW) hazard may occur;

in response to determining that a RBW hazard may occur:

generating a message (QA) to a first check node, wherein the QA message is generated from a previous result (RA) from the first check node;

generating a message (QB) to a second check node, wherein the QB message is generated from the previous result (RA) and is transmitted before a result (R'A) is received from the first check node;

receiving the result (R'A) from the first check node;

computing a difference (R"A) between the result (R'A) and the result (RA);

receiving a result (R'B) from the second check node; and computing a bit value P(B) using the difference (R"A) and the result (R'B);

whereby the RBW hazard is avoided as a result of computing QB before receiving the result R'A from the first check node.

2. The method of claim 1, further comprising storing the previous result (RA).

3. The method of claim 1, wherein generating the message (QA) comprises generating the message (QA) from (QA=P−RA), wherein P is a previous bit value and RA is the previous result from the first check node.

4. The method of claim 1, wherein generating (QB) comprises determining (QB) from (QB=P−RB), wherein P is a previous bit value and RB is a previous result value from the second check node.

5. The method of claim 1, further comprising computing the difference (R"A) from (R'A−RA).

6. The method of claim 1, wherein computing the bit value P(B) comprises determining P(B) from (P(B)=QB+R'B+R"A).

7. The method of claim 1, wherein the decoder comprises a low density parity check (LDPC) decoder.

8. The method of claim 7, wherein the first and second check nodes are adjacent to a bit node and the method further comprises extending the method to mitigate the RBW hazard for additional check nodes that are adjacent to the bit node.

9. The method of claim 7, wherein determining that a RBW hazard may occur comprises determining the RBW hazard from knowledge of a LDPC code.

10. The method of claim 7, wherein determining that a RBW hazard may occur comprises determining the RBW hazard on-the-fly during decoding.

11. A digital data decoder, comprising:

means for determining that a Read-Before-Write (RBW) hazard may occur;

means for generating a message (QA) to a first check node, the message (QA) determined from a previous result (RA) from the first check node;

means for generating a message (QB) to a second check node from the previous result (RA) and is transmitted before a result (R'A) is received from the first check node;

means for receiving a result (R'A) from the first check node;

means for computing a difference (R"A) between the result (R'A) and the result (RA) when the RBW hazard may occur;

means for receiving a result (R'B) from the second check node; and means for computing a bit value P(B) using the difference (R"A) and the result (R'B);

whereby the RBW hazard is avoided as a result of computing QB before receiving the result R'A from the first check node.

12. The data decoder of claim 11, further comprising a cache memory that stores the result (RA).

13. The digital data decoder of claim 11, wherein the means for generating the message (QA) comprises means for generating the message (QA) from (QA=P−RA), wherein P is a previous bit value and RA is the previous result from the first check node.

14. The digital data decoder of claim 11, wherein the means for generating (QB) comprises means for determining (QB) from (QB=P−RB), wherein P is a previous bit value and RB is a previous result value from the second check node.

15. The digital data decoder of claim 11, further comprising means for computing the difference (R"A) from (R'A−RA).

16. The digital data decoder of claim 11, wherein the means for computing the bit value P(B) comprises means for computing P(B) from (P(B)=QB+R'B+R"A).

17. The digital data decoder of claim 11, wherein the apparatus comprises a low density parity check (LDPC) decoder.

18. The digital data decoder of claim 17, wherein the LDPC decoder detects RBW hazards from at least one of knowledge of a LDPC code and on-the-fly during operation of the LDPC decoder.

19. A method performed by a digital data decoder, comprising:

detecting a read before write (RBW) hazard associated with first and second check nodes;

generating messages (QA) and (QB) to the first and second check nodes, respectively, wherein the (QA) and (QB) messages are generated from a previous result (RA) from the first check node, each message transmitted before a result (R'A) is received from the first check node;

receiving a result (R'A) from the first check node and a result (R'B) from the second check node; and computing a new bit node value based on the result (R'A) and the result (R'B);

whereby the RBW hazard is avoided as a result of computing QB before receiving the result R'A from the first check node.

20. The method of claim 19, further comprising:

computing a difference (R"A) between the result (R'A) and the result (RA) when the RBW hazard may occur;

wherein the computing of the new bit node value comprises calculating the new bit node value from (P(B)=QB+R'B+R"A).

* * * * *